United States Patent
Klehn et al.

(10) Patent No.: US 7,307,869 B2
(45) Date of Patent: Dec. 11, 2007

(54) METHOD AND CIRCUIT FOR READING A DYNAMIC MEMORY CIRCUIT

(75) Inventors: Bernd Klehn, Unterhaching (DE); Hermann Fischer, München (DE); Eckhard Brass, Unterhaching (DE); Ralf Klein, Deidesheim (DE); Thomas Schumann, Darmstadt (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/293,880

(22) Filed: Dec. 2, 2005

(65) Prior Publication Data
US 2006/0146593 A1 Jul. 6, 2006

(51) Int. Cl.
*G11C 11/24* (2006.01)

(52) U.S. Cl. .............. 365/149; 365/207; 365/185.21; 365/196; 365/205

(58) Field of Classification Search .......... 365/196, 365/207, 149, 203, 185.21, 205
See application file for complete search history.

(56) References Cited

U.S. PATENT DOCUMENTS

| | | | | |
|---|---|---|---|---|
| 4,584,672 A | * | 4/1986 | Schutz et al. | 365/203 |
| 6,768,686 B2 | * | 7/2004 | Frey | 365/189.07 |
| 6,856,564 B2 | * | 2/2005 | Baker | 365/207 |
| 2003/0043668 A1 | | 3/2003 | Wickman | |
| 2004/0233758 A1 | * | 11/2004 | Kim et al. | 365/222 |

* cited by examiner

*Primary Examiner*—Amir Zarabian
*Assistant Examiner*—Anthan T Tran
(74) *Attorney, Agent, or Firm*—Patterson & Sheridan, L.L.P.

(57) ABSTRACT

A method for reading data from a dynamic memory circuit is provided, wherein at least one memory cell can be addressed via a word line and a bit line, wherein the memory cell is connected to a first reading amplifier via the bit line, and wherein a switching element, which in the off state isolates the first reading amplifier from the bit line, is provided. The method comprises: a) turning on the switching element to connect the first reading amplifier to the bit line, b) activating the word line to activate the memory cell for reading, c) activating the first reading amplifier to initiate assessment of the information on the bit line, d) turning off the switching element to isolate the first reading amplifier from the bit line, and e) transferring the information which has been read to a data bus.

17 Claims, 2 Drawing Sheets

METHOD AND CIRCUIT FOR READING A DYNAMIC MEMORY CIRCUIT

CROSS-REFERENCE TO RELATED APPLICATIONS

This application claims foreign priority benefits under 35 U.S.C. §119 to co-pending German patent application number DE 10 2004 058 131.2-55, filed 2 Dec. 2004. This related patent application is herein incorporated by reference in its entirety.

BACKGROUND OF THE INVENTION

1. Field of the Invention

The invention relates to a method for quickly reading a data item from a dynamic memory cell. The invention also relates to a reading circuit and a dynamic memory circuit for carrying out the method.

2. Description of the Related Art

Dynamic semiconductor memories, such as dynamic random access memories (DRAMs), have memory cells with storage capacitors whose charge can be switchably applied to a bit line using a word line. To be able to detect the small charge in a storage capacitor, reading amplifier circuits are used which can detect the smallest charge differences between two adjacent bit lines. The reading circuits amplify the difference, brought about by the charge in the memory cell, between the electrical potentials on the respective bit line and a bit line which is adjacent thereto, and in so doing pull the bit line with the lower potential to a prescribed low potential and pull the bit line with the higher potential to a prescribed high potential. This amplification operation simultaneously serves to write back the charge information to the memory cell again.

The need for writing back means that the electrical potential on the entire bit line, which represents a high capacitive load, needs to be raised or lowered to the prescribed value. Only when the prescribed electrical potentials have appeared on the two bit lines is it possible to connect the information from the memory cell to the data bus. A particular drawback of this conventional concept is that the duration of the read operation is directly dependent on the time required for the change in potential on the bit line and hence on the duration of the write-back operation.

FIG. 1 shows an example of a reading circuit for a column of memory cells in a dynamic memory circuit based on the prior art.

Dynamic semiconductor memories, e.g., DRAMs, have a multiplicity of memory cells which are arranged in rows and columns in a matrix and which are usually addressed via word lines and bit lines. In this case, each memory cell is arranged on a word line and on a bit line and has a selection transistor and a storage capacitor, e.g., in the form of a trench capacitor. For the purpose of simplification, FIG. 1 shows just a single memory cell M which is connected to a bit line BL and a word line WL. The storage capacitor in the memory cell M can store a unit of information in the form of a prescribed charge. To read the content of the dynamic memory cell M, the selection transistor in this memory cell M is activated by means of the associated word line WL, and the memory cell M is therefore connected to the associated bit line BL. The charge which flows from the storage capacitor to the bit line BL in the process increases the electrical potential of the bit line BL. Since the bit line BL represents a high capacitive load for the memory cell M, the change in potential on the bit line BL turns out to be very small, however. To detect the electrical potential of the bit line BL, a reading amplifier SA is normally used which is in the form of a differential amplifier (sense amplifier). The reading amplifier SA compares the electrical potential of the bit line BL with the electrical potential of an adjacent bit line $\overline{BL}$, the "complementary bit line", and amplifies the potential difference which exists between the two lines BL, $\overline{BL}$. In this case, that bit line which has the higher electrical potential is pulled to a prescribed high potential, and the other is pulled to a prescribed low potential.

Since the reading amplifier SA in a conventional reading circuit also has the task, besides that of assessing the information on the bit line BL, of writing back the information which has been read to the memory cell M again, the potential of the entire bit line BL must first be pulled to the prescribed value before the reading amplifier SA can be connected to the appropriate data lines and the information can be forwarded to the data bus DAT.

On account of the capacitive load which the entire bit line BL represents, the desired bit line potential does not appear until after a corresponding delay. For this reason, in the conventional concept, the information is forwarded to the data bus DAT only with the corresponding delay, with the duration of the entire read operation being directly dependent on the time required for the change in potential on the bit line BL and hence on the duration of the write-back operation.

SUMMARY OF THE INVENTION

It is therefore an object of the invention to increase the reading speed for data from dynamic memory cells.

The invention provides a dynamic memory circuit in which at least one memory cell can be addressed via a word line and an associated bit line, wherein the memory cell is connected to a first reading amplifier via the bit line, and wherein a switching element, which in the off state isolates the first reading amplifier from the bit line, is provided between the bit line and the reading amplifier. According to the invention, turning off the switching element decouples the bit line, which represents a relatively high capacitive load, from the first reading amplifier during the assessment operation. The first reading amplifier therefore does not need to set the potential on the entire bit line, but rather just on the subregion of the line which is decoupled from the bit line. Since this subregion represents a significantly smaller capacitive load than the bit line, the change in the electrical potential on this subregion and hence the assessment operation for the potential difference between the bit line and the adjacent complementary bit line may take place more quickly in comparison with a conventional reading method. This significantly reduces the effective reading time for the memory cells and increases the performance of the dynamic memory circuit.

In one advantageous embodiment of the invention, after the switching element has been turned off, the information is written back to the memory cell by means of a second reading amplifier. In this case, the second reading amplifier is connected to the memory cell via the bit line and is isolated from the first reading amplifier when the switching element is turned off. Since reading the information from the memory cell and writing back this information to the memory cell again advantageously take place using two separate circuits, these circuits can be optimized for their respective task independently of one another. By isolating the two reading amplifiers using the switching element, the information is read and forwarded to the data bus at an independent time from the operation for writing back the information to the memory cell.

According to a further embodiment of the invention, the information is written back by the second reading amplifier only after the information has been transferred to the data bus. This timing order avoids possible disturbances to the first reading amplifier during assessment of the information as a result of the second reading amplifier's write-back operation.

In a further advantageous embodiment of the invention, the write-back operation by the second reading amplifier takes place at least partly concurrently with the assessment of the information on the bit line by the first reading amplifier and/or to the transfer of the information to the data bus by the first reading amplifier. Since the bit line and the second reading amplifier, according to the invention, are decoupled from the first reading amplifier by means of the switching element at the actual start of the assessment operation by the first reading amplifier, the write-back operation takes place independently of the assessment operation. The write-back operation can therefore take place just shortly after the first reading amplifier is decoupled, that is to say, concurrently with the assessment of the information on the bit line by the first reading amplifier or to the transfer of the information to the data bus by the first reading amplifier. This advantageously allows further optimization of access to the memory circuit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

To speed up a read operation, the inventive concept illustrated below provides for the read operation to be performed independently of the write operation.

Figure 1:
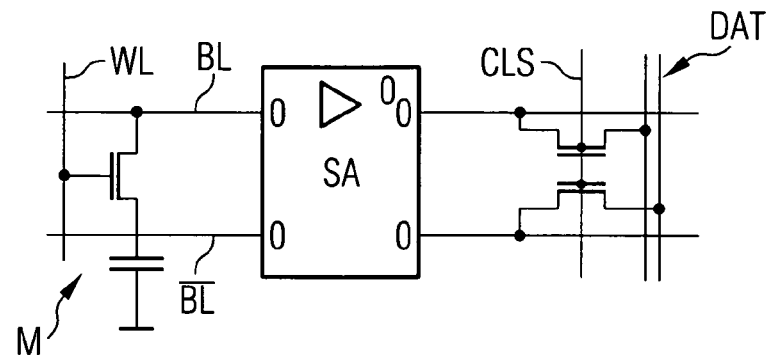
FIG. 1 schematically shows a conventional reading circuit for a dynamic memory circuit.
Figure 2:
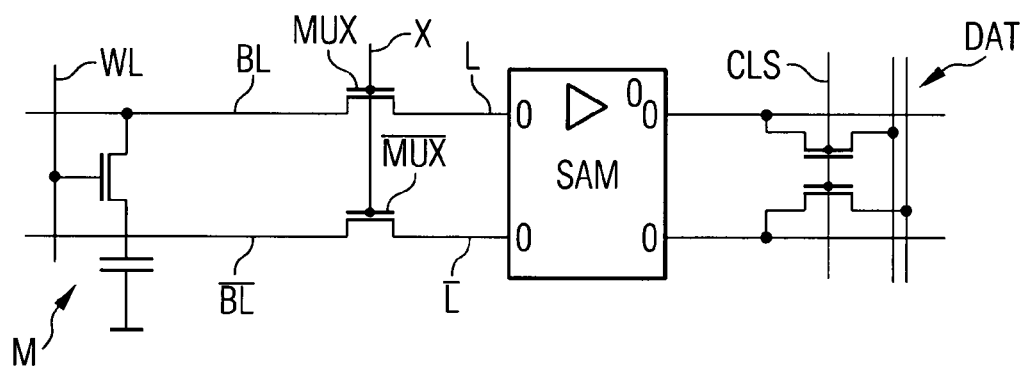
FIG. 2 schematically shows a first exemplary embodiment of the reading circuit based on the invention.

FIG. 2 shows a first example of an inventive reading circuit for a dynamic memory. In this context, in similar fashion to FIG. 1, one bit line BL with just a single memory cell M has been shown for reasons of clarity. Normally, the bit line BL is connected to a multiplicity of memory cells. The memory cell M illustrated here is connected to an associated word line WL. In addition, an amplifier circuit SAM is provided for reading an information charge stored in the memory cell M. The amplifier circuit SAM is connected to the memory cell M via the bit line BL. To transfer the information which has been read to a data bus DAT, the reading amplifier SAM is connected to lines of the data bus DAT via a switching device. This switching device is activated via an appropriate control line CLS for column selection.

In addition, the reading amplifier is connected to a further line $\overline{BL}$, which is adjacent to the bit line BL. This line $\overline{BL}$ is the complementary bit line which is used for the read operation for the dynamic memory cell M.

In contrast to the conventional reading circuit shown in FIG. 1, the inventive concept provides a switching element MUX which is arranged between the bit line BL and the reading amplifier SAM. The switching element MUX, which is preferably in the form of a semiconductor transistor, in the off state isolates the reading amplifier SAM from the bit line BL and from the memory cell M. In addition, a further switching element $\overline{MUX}$ is provided between the complementary bit line $\overline{BL}$ and the reading amplifier SAM, said further switching element being of similar design to the first switching element MUX and in the off state isolating the reading amplifier SAM from the complementary bit line $\overline{BL}$. The two switching elements MUX, $\overline{MUX}$ are switched via a common control line X.

To read the unit of information stored in the memory cell M, the memory cell M is activated by the associated word line WL. Preferably, however, the switching element MUX is turned on beforehand by activating the appropriate control line X, and hence the reading amplifier SAM is electrically conductively connected to the bit line BL. Activating the word line activates the selection transistor in the memory cell and connects the storage capacitor to the bit line BL. As a result, the charge stored in the storage capacitor flows to the bit line BL and thus changes the electrical potential thereof. Since the switching element MUX has already been turned on beforehand, the potential of the bit line is also applied to the reading amplifier SAM or to a corresponding line section L connecting the reading amplifier SAM to the switching element MUX. To detect the change in potential on the bit line BL, the reading amplifier SAM is activated, in which case it compares the electrical potential of the bit line BL with that of the complementary bit line $\overline{BL}$ and pulls the two potentials apart.

To speed up the read operation, the invention provides for the reading amplifier SAM to be decoupled from the memory cell M and the bit line BL during the assessment operation. To this end, the switching transistor MUX is turned off during the assessment operation, with an appropriate control signal being applied to the control line X for the switching transistors MUX, $\overline{MUX}$. This is preferably done immediately after the memory cell M is activated and as soon as the reading amplifier SAM has started to assess the potential difference between the two lines BL, $\overline{BL}$. By turning off the switching transistor MUX, the reading amplifier SAM is decoupled from the memory cell M and the bit line BL. At the same time, the complementary switching transistor $\overline{MUX}$ connected to the same control line X is turned off, and the reading amplifier SAM is decoupled from the complementary bit line $\overline{BL}$. As a result of the bit lines BL, $\overline{BL}$ being decoupled, the reading amplifier SAM needs to change the potential only on a line section L which is relatively small in comparison with the bit line BL. When the potential difference between the bit line BL and the complementary bit line $\overline{BL}$ is assessed, the reading amplifier SAM therefore pulls the potentials of the relatively short line sections L, $\overline{L}$ apart.

As soon as the reading amplifier SAM has set the respective electrical potential on the corresponding line sections L, $\overline{L}$, the information which has been read can be forwarded to the data bus DAT. This is done in a similar fashion to conventional methods by activating the switching device using the appropriate control line CLS, so that an electrical connection is produced between the reading amplifier SAM and the corresponding lines of the data bus DAT.

Since the inventive concept involves the large capacitive load represented by the bit lines BL, $\overline{BL}$ being decoupled from the reading amplifier SAM, the latter therefore now sees only the relatively small capacitive load of the line sections L, $\overline{L}$ which are isolated from the bit lines BL, $\overline{BL}$. This means that the potential on the line sections L, $\overline{L}$ which is required for forwarding to the data bus can be reached much more quickly. Depending on the embodiment, this results in a significantly reduced reading time in comparison with conventional reading concepts.

In a dynamic memory circuit, the information which has been read from the memory cell M then needs to be written back to the memory cell M again to preserve the content of the memory cell. To produce a write-back operation in the inventive concept, two alternative methods are used in principle. First, the information can be written back to the memory cell M in similar fashion to the conventional concept using the reading amplifier SAM which has already been used for reading. Secondly, provision is made for reading and writing back to take place using two separate amplifier circuits. In the case of the first variant, writing back is not performed until after the read operation has concluded and the information has been forwarded to the data bus DAT. In the case of the second variant, the write-back operation can take place at least partly concurrently with the read operation on account of the separate amplifier circuits.

FIG. 2 shows a reading circuit based on the first variant with just a single reading amplifier SAM, which is used both for reading and for writing back the information.

To write back the information to the memory cell M, the reading amplifier SAM needs to be connected to the bit line BL and to the complementary bit line $\overline{BL}$ again. This is done by turning on the appropriate switching transistors MUX, $\overline{MUX}$. Depending on what potential difference there is between the bit line BL and the associated line section L, this results in potential equalization between these two lines BL, L, so that an electric current flows through the switching element MUX. This likewise applies to the complementary bit line $\overline{BL}$ and the associated complementary line section $\overline{L}$, which are connected to one another by turning on the second switching element $\overline{MUX}$. Since the amplifier circuit SAM is still active since the read operation, it counteracts a change in the electrical potential on the line sections L, $\overline{L}$ which is brought about by the potential equalization. As a result, the relative potential difference between the two line sections L, $\overline{L}$ and hence the information which has been read are retained during the entire write-back operation.

After the electrical potential corresponding to the previously read information has appeared on the bit line BL, the memory cell M is connected to the bit line BL by activating said memory cell's selection transistor, so that a charge corresponding to the information can flow back into the capacitor in the memory cell M. Alternatively, the memory cell M may actually remain active during the entire write-back operation, so that the desired charge information flows into the storage capacitor in the memory cell M when the potential actually appears on the bit line BL. When the storage capacitor in the memory cell M has been charged with the requisite amount of charge, the memory cell M is isolated from the bit line BL by deactivating said memory cell's selection transistor.

The first variant of the inventive reading circuit, which is shown in FIG. 2, is distinguished by low additional circuit complexity. Producing it requires just two additional switching elements MUX, $\overline{MUX}$ per bit line pair BL, $\overline{BL}$, an additional control line X and an appropriate control circuit for producing the actuation signals for the switching elements MUX, $\overline{MUX}$.

Whereas, in the first variant, the write-back operation takes place at a time after the read operation on account of the single reading amplifier SAM, the subsequently illustrated reading circuit based on the second variant is distinguished in that the write-back operation and the read operation can take place at essentially parallel times (i.e., substantially concurrently). This allows the access time for the memory circuit to be reduced even further.

Figure 3:
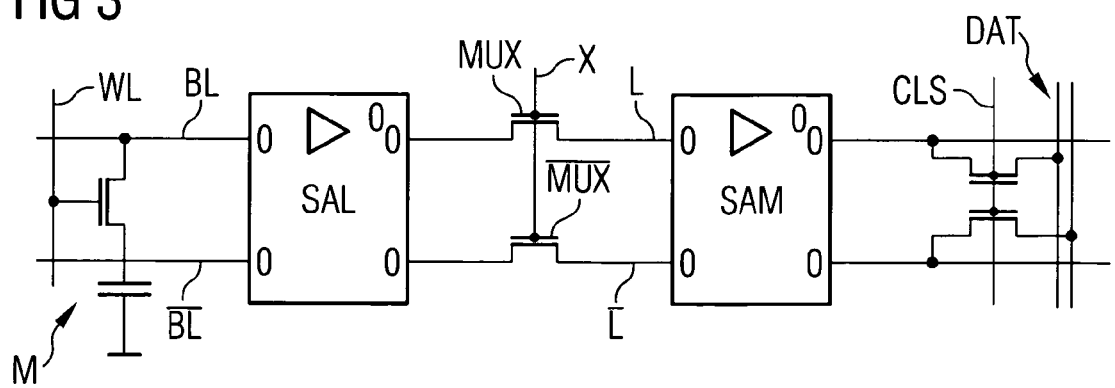
FIG. 3 schematically shows a further exemplary embodiment of the inventive reading circuit.

FIG. 3 shows an exemplary embodiment of the inventive reading circuit with two separate amplifier circuits SAM, SAL for reading and writing back the information. In this case, the reading circuit is again connected via a bit line BL to a multiplicity of memory cells in a column of a matrix-like memory cell array. For reasons of clarity, the memory cells on the relevant bit line BL are represented by a single memory cell M. To read the relevant memory cell M, in similar fashion to the reading circuit shown in the previous exemplary embodiment, there is a first reading amplifier SAM which is connected to the bit line BL and to the memory cell M via a switching element MUX. In the off state, the switching element MUX isolates the first reading amplifier SAM from the rest of the bit line and the memory cell M.

In contrast to the reading circuits shown in FIGS. 1 and 2, which provide just a single amplifier circuit for the read and write-back operations, the reading circuit shown in FIG. 3 has a second reading amplifier SAL for writing back the information to the memory cell M. In this case, the second reading amplifier is arranged such that turning off the switching element MUX isolates the two reading amplifiers SAM, SAL from one another, while the second reading amplifier SAM remains connected to the bit line BL.

The charge information is read from the memory cell independently of the write-back operation and essentially in similar fashion as in the previous exemplary embodiment. In this context, the switch MUX is first turned on, and hence the first reading amplifier SAM is connected to the bit line BL. The word line WL is then used to activate the selection transistor in the memory cell M, said selection transistor in turn being used to set up an electrical connection between the storage capacitor and the associated bit line BL. In this context, charge information stored in the storage capacitor in the memory cell M flows to the bit line BL, which changes the electrical potential of the bit line BL slightly.

To detect the change in the electrical potential of the bit line BL, the first reading amplifier SAM is used, in similar fashion as the reading amplifier in FIG. 2. This reading amplifier is preferably in the form of a differential amplifier (sense amplifier). The first reading amplifier SAM assesses the electrical potential of the bit line BL by comparing it with the electrical potential of an adjacent bit line $\overline{BL}$, the "complementary bit line", and amplifying the potential difference which exists between the two lines BL, $\overline{BL}$. In this case, the bit line with the higher detected electrical potential is pulled to a prescribed high potential, and the bit line with the lower detected electrical potential is pulled to a prescribed low potential.

During the assessment operation, the first reading amplifier SAM is decoupled from the bit line BL, from the memory cell M and from the second reading amplifier SAL by turning off the switching transistor MUX arranged between the first and second reading amplifiers SAL, SAM.

In this case, the switching element MUX is turned off immediately after a sufficiently large potential difference, which can be detected by the first reading amplifier SAM, has appeared on account of the charge in the memory cell M between the bit line BL and its complementary bit line $\overline{BL}$. This is normally the case directly after the selection transistor in the respective memory cell M has been activated. The delay with which the switching transistor MUX is activated is dependent particularly on the level of the charge stored in the memory cell M, the capacitances of the bit line BL and of the memory cell M and also the switching times of the transistors involved, and may thus vary depending on the circuit design.

Since the switching elements MUX, $\overline{MUX}$ are actuated together, turning off the switching element MUX involves the first reading amplifier SAM likewise being isolated from the complementary bit line $\overline{BL}$.

When the first amplifier circuit SAM has been decoupled from the two bit lines BL, $\overline{BL}$, the first reading amplifier SAM needs to pull apart only the potentials of the two line sections L, $\overline{L}$ which are isolated from the bit lines BL, $\overline{BL}$. Since these line sections L, $\overline{L}$ represent a low capacitive load in comparison with the entire bit line, the information on these line sections L, $\overline{L}$ can be assessed more quickly than in the case of the conventional reading method. This allows a significant reduction in the time required for the read operation.

To write back the information to the memory cell M again, the second reading amplifier SAL is activated preferably immediately after the switching elements MUX, $\overline{MUX}$ have been turned off. In this case, the potential difference which still exists between the two bit lines BL, $\overline{BL}$ on account of the charge information which has been read from the memory cell M is amplified by the second amplifier circuit SAL. This involves the bit line with the higher detected electrical potential being pulled to a prescribed high potential and the bit line with the lower detected electrical potential being pulled to a prescribed low potential. As soon as the bit line BL has the prescribed electrical potential, the memory cell M is connected to the bit line BL by turning on the selection transistor.

In this case, the write-back operation preferably takes place concurrently with the read operation, i.e., for assessing the electrical potentials of the two line sections L, $\overline{L}$ using the first reading amplifier SAM and for transferring the information to the data bus DAT.

Alternatively, it is also possible to activate the second reading amplifier SAL at the actual time at which or before the switching element MUX is turned off, in order to initiate the operation for writing back the information to the memory cell M. In addition, it would also be possible to activate the second reading amplifier SAL at the same time as or even before the first reading amplifier SAM. However, these alternatives presuppose that the activation of the second reading amplifier SAL does not adversely affect or disturb the assessment of the information by the first reading amplifier SAM.

The arrangement of the second reading amplifier SAL, which is shown by way of example in FIG. 3, is not absolutely necessary. Rather, it is also possible to arrange the second reading amplifier at the other end of the bit line BL or within the bit line BL. In addition, the second reading amplifier SAL could be arranged as an external amplifier circuit outside of the bit line BL and could be connected thereto merely by separate lines (not shown here).

Figure 4:
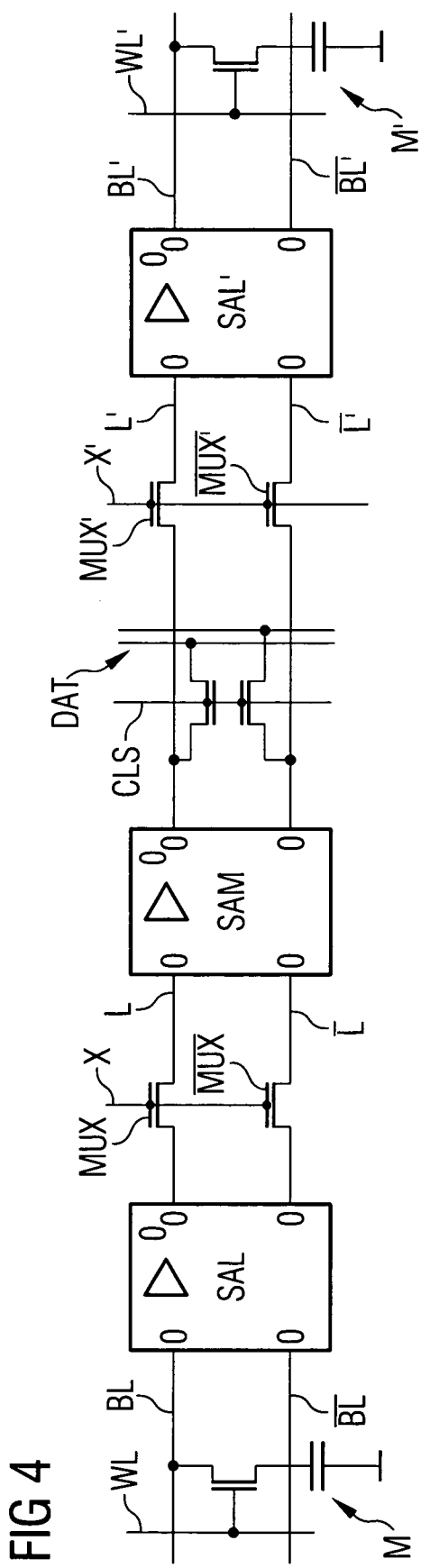
FIG. 4 schematically shows a further inventive reading circuit in a shared bit line form.

FIG. 4 shows a further example of the invention, wherein the memory circuit has an "open bit line architecture". In this case, the reading circuit for a memory cell array is arranged between two bit lines BL, BL'. The circuit shown here comprises two reading circuits combined with one another, with the two reading circuits sharing a common first reading amplifier SAM, but having separate second reading amplifiers SAL, SAL' for writing back information to the respective memory cells M, M'. Depending on requirements, the first reading amplifier SAM can be selectively connected to the left-hand bit lines BL, $\overline{BL}$ via the jointly controlled switching elements MUX, $\overline{MUX}$ or to the right-hand bit lines BL', $\overline{BL}$' via the switching elements MUX', $\overline{MUX}$' which are jointly connected to a further control line X', in order to access the memory cells M, M' in the relevant left-hand or right-hand bit line BL, BL'.

All the features of the invention which are disclosed in the claims, in the description and in the drawings may be fundamental to the invention both individually and in combination.

While the foregoing is directed to embodiments of the present invention, other and further embodiments of the invention may be devised without departing from the basic scope thereof, and the scope thereof is determined by the claims that follow.

What is claimed is:

1. A method for reading data from a dynamic memory circuit having at least one memory cell which is addressable via a word line and a bit line, comprising:
   a) turning on a switching element to connect a first reading amplifier to the bit line, wherein the switching element in the off state isolates the first reading amplifier from the bit line,
   activating the word line to read the memory cell, and activating the first reading amplifier to initiate assessment of an information on the bit line;
   b) turning off the switching element to decouple the bit line from the first reading amplifier, and activating a second reading amplifier, wherein the second reading amplifier is connected to the memory cell via the bit line and connected between the switching element and the memory cell, the second reading amplifier being isolated from the first reading amplifier when the switching element is turned off;
   c) when the switching element is turned off, writing the information back to the memory cell by utilizing the second reading amplifier connected to the memory cell via the bitline and
   transferring the information which has been read by the first reading amplifier to a data bus.

2. The method of claim 1, wherein the information is written back after the information has been transferred to the data bus.

3. The method of claim 1, wherein the information is written back by the second reading amplifier at least partly concurrently with the assessment of the information on the bit line by the first reading amplifier.

4. The method of claim 1, wherein the information is written back by the second reading amplifier at least partly concurrently with the transfer of the information to the data bus by the first reading amplifier.

5. A reading circuit for a dynamic memory circuit having at least one memory cell which is addressable via a word line and a bit line, comprising:
   a first reading amplifier which, when activated, reads and assesses information stored in the memory cell, wherein the information which has been assessed by the first reading amplifier is transferred to a data bus connected to the first reading amplifier;

a switching element disposed between the first reading amplifier and the bit line connected to the memory cell, wherein the switching element, when in the off state, isolates the first reading amplifier from the bit line, and when turned on, connects the bit line to the first reading amplifier; and a second reading amplifier which, when activated, writes back the information to the memory cell, wherein the second reading amplifier is connected to the memory cell via the bit line and connected between the switching element and the memory cell, wherein the switching element, when in the off state, isolates the first reading amplifier from the second reading amplifier, wherein, when the switching element is turned on, the first reading amplifier is activated to initiate assessment of an information on the bit line, and when the switching element is turned off, the second reading amplifier is activated to write the information back to the memory cell and the information which has been read by the first reading amplifier is transferred to the data bus.

6. The reading circuit of claim 5, wherein at least one of the first reading amplifier and the second reading amplifier comprises a sense amplifier.

7. The reading circuit of claim 5, wherein the switching element comprises a transistor.

8. The reading circuit of claim 5, further comprising: a further switching element disposed between the first reading amplifier and a complementary bit line provided for assessing the information on the bit line.

9. The reading circuit of claim 8, further comprising: a common control line connected to actuate the two switching elements.

10. The reading circuit of claim 5, wherein the first reading amplifier is arranged at an edge of a memory cell array.

11. The reading circuit of claim 5, wherein the second reading amplifier is arranged at an edge of a memory cell array.

12. The reading circuit of claim 5, further comprising:
a further reading amplifier, connected to a second memory cell via a second bit line, for writing back information to the second memory cell; and
a second switching element disposed between the first reading amplifier and the further reading amplifier, wherein, when the second switching element is activated, the first reading amplifier is connected on a side opposite the bit line to a second memory cell via a second bit line, and wherein the second switching element, in the off state, isolates the first reading amplifier from the second memory cell, the second bit line and the further reading amplifier.

13. The reading circuit of claim 5, further comprising:
a second switching element disposed between the first reading amplifier and a complementary bit line provided for assessing the information on the bit line, wherein the second switching element, when in the off state, isolates the first reading amplifier from the complementary bit line, and when activated, connects the complementary bit line to the first reading amplifier.

14. The reading circuit of claim 13, further comprising:
a common control line connected to actuate the first and second switching elements.

15. A dynamic memory circuit, comprising:
a plurality of memory cells arranged in a matrix, the memory cells addressed via respective bit lines and word lines; and
a respective reading circuit connected to each respective memory cell, comprising:
a first reading amplifier which, when activated, reads and assesses information stored in the respective memory cell, wherein the information which has been assessed by the first reading amplifier is transferred to a data bus connected to the first reading amplifier;
a switching element disposed between the first reading amplifier and the respective bit line connected to the respective memory cell, wherein the switching element, when in the off state, isolates the first reading amplifier from the respective bit line, and when activated, connects the respective bit line to the first reading amplifier; and
a second reading amplifier which, when activated, writes back the information to the memory cell, wherein the second reading amplifier is connected to the memory cell via the bit line and connected between the switching element and the memory cell, wherein the switching element, when in the off state, isolates the first reading amplifier from the second reading amplifier,
wherein, when the switching element is turned on, the first reading amplifier is activated to initiate assessment of an information on the bit line, and when the switching element is turned off, the second reading amplifier is activated to write the information back to the memory cell and the information which has been read by the first reading amplifier is transferred to the data bus.

16. The dynamic memory circuit of claim 15, wherein each respective reading circuit further comprises:
a second switching element disposed between the first reading amplifier and a respective complementary bit line provided for assessing the information on the respective bit line, wherein the second switching element, when in the off state, isolates the first reading amplifier from the respective complementary bit line, and when activated, connects the complementary bit line to the first reading amplifier; and
a common control line connected to actuate the first and second switching elements.

17. The dynamic memory circuit of claim 15, wherein the second reading amplifier is configured to write back information to the respective memory cell at least partly concurrently with one of:
(i) while information on the bit line is being assessed by the first reading amplifier; and
(ii) while the information is being transferred to the data bus by the first reading amplifier.

* * * * *

UNITED STATES PATENT AND TRADEMARK OFFICE
CERTIFICATE OF CORRECTION

| | | |
|---|---|---|
| PATENT NO. | : 7,307,869 B2 | Page 1 of 1 |
| APPLICATION NO. | : 11/293880 | |
| DATED | : December 11, 2007 | |
| INVENTOR(S) | : Bernd Klehn et al. | |

It is certified that error appears in the above-identified patent and that said Letters Patent is hereby corrected as shown below:

On the Title Page:

Please insert --(30)     Foreign Application Priority Data

December 2, 2004     (DE) ............10 2004 058 131--.

Signed and Sealed this

Nineteenth Day of August, 2008

JON W. DUDAS
*Director of the United States Patent and Trademark Office*